United States Patent
Lee

(10) Patent No.: US 11,087,805 B2
(45) Date of Patent: Aug. 10, 2021

(54) APPARATUS WITH A BIASING MECHANISM AND METHODS FOR OPERATING THE SAME

(71) Applicant: Micron Technology, Inc., Boise, ID (US)

(72) Inventor: Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/064,545

(22) Filed: Oct. 6, 2020

(65) Prior Publication Data
US 2021/0020210 A1    Jan. 21, 2021

Related U.S. Application Data

(62) Division of application No. 16/514,254, filed on Jul. 17, 2019, now Pat. No. 10,839,873.

(51) Int. Cl.
| | | |
|---|---|---|
| G11C 16/04 | (2006.01) | |
| G11C 7/12 | (2006.01) | |
| G11C 8/08 | (2006.01) | |
| G11C 7/06 | (2006.01) | |

(52) U.S. Cl.
CPC ............... *G11C 7/12* (2013.01); *G11C 7/062* (2013.01); *G11C 8/08* (2013.01)

(58) Field of Classification Search
CPC .............. G11C 7/12; G11C 7/062; G11C 8/08
USPC ........................ 365/189.011–225.7
See application file for complete search history.

(56) References Cited

U.S. PATENT DOCUMENTS

| | | | | |
|---|---|---|---|---|
| 6,661,714 | B2 * | 12/2003 | Lee ........................ | G11C 7/065 365/189.11 |
| 7,630,257 | B2 * | 12/2009 | Madan .................... | G11C 11/22 365/190 |
| 8,971,096 | B2 * | 3/2015 | Jung ...................... | G11C 11/419 365/154 |
| 9,202,531 | B2 | 12/2015 | Seo | |
| 10,586,586 | B1 | 3/2020 | Lee et al. | |
| 2003/0002353 | A1 * | 1/2003 | Lee ...................... | G11C 11/4074 365/189.11 |
| 2008/0084773 | A1 * | 4/2008 | Madan .................... | G11C 11/22 365/202 |
| 2015/0029782 | A1 * | 1/2015 | Jung ........................ | G11C 8/16 365/154 |

* cited by examiner

*Primary Examiner* — Harry W Byrne
(74) *Attorney, Agent, or Firm* — Perkins Coie LLP

(57) ABSTRACT

Methods, apparatuses, and systems related to a memory device are described. The memory device may include a sense amplifier that is configured to simultaneously precharge sensing nodes therein and compensate for threshold voltage mismatches between any transistors therein. The sense amplifier may be configured to charge gut nodes therein without connecting to a separate precharging voltage.

20 Claims, 9 Drawing Sheets

# APPARATUS WITH A BIASING MECHANISM AND METHODS FOR OPERATING THE SAME

CROSS-REFERENCE TO RELATED APPLICATION(S)

This application is a division of U.S. application Ser. No. 16/514,254, filed Jul. 17, 2019; which is incorporated herein by reference in its entirety.

TECHNICAL FIELD

The disclosed embodiments relate to devices, and, in particular, to semiconductor memory devices with a self-biasing mechanism and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

DETAILED DESCRIPTION

Figure 1:
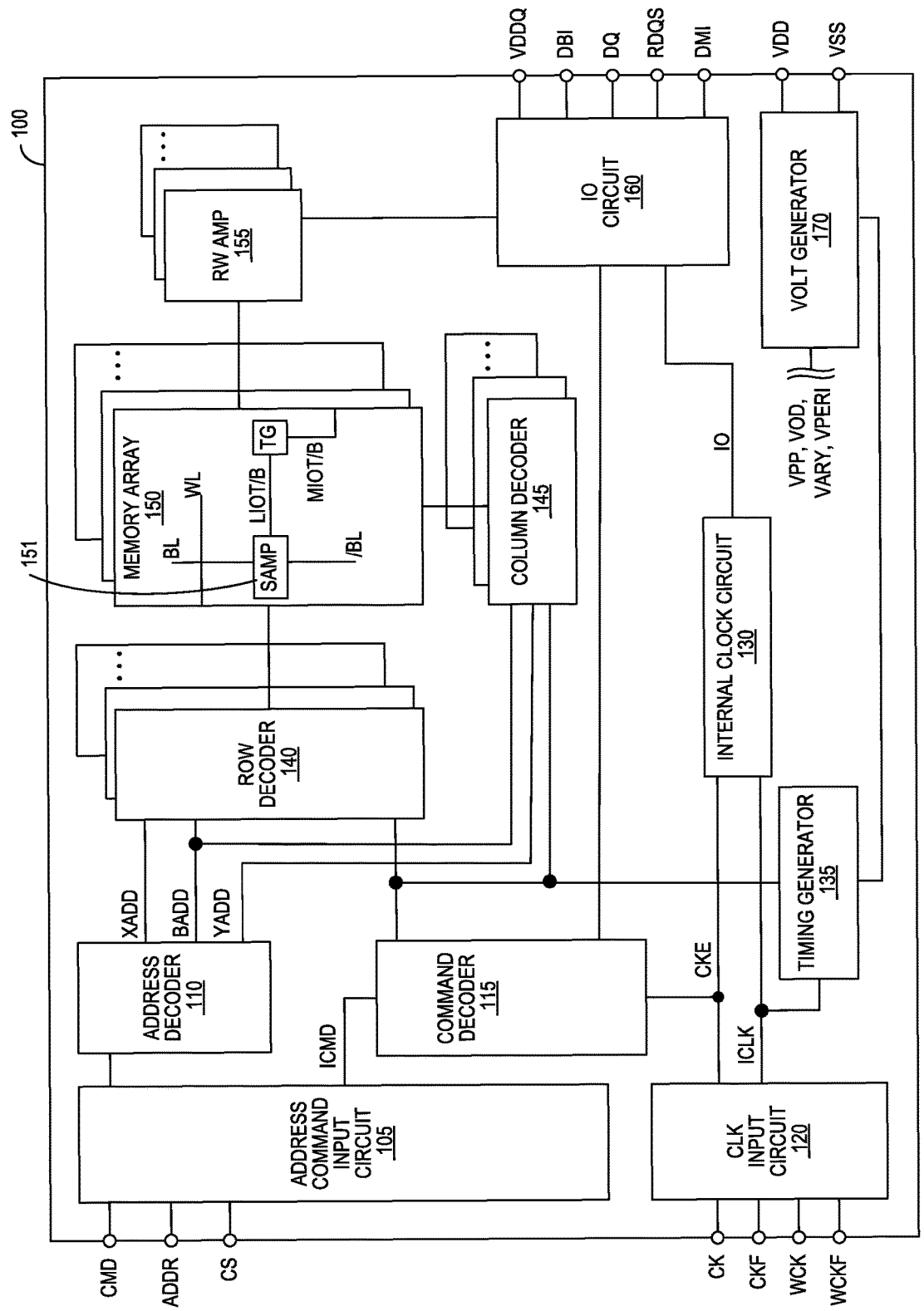
FIG. 1 is a block diagram of an apparatus in accordance with an embodiment of the present technology.

As described in greater detail below, the technology disclosed herein relates to an apparatus, such as for memory systems, systems with memory devices, related methods, etc., for managing threshold voltage mismatches across transistors. The apparatus (e.g., a memory device and/or a system including the memory device) can include a sense amplifier with a self-biasing mechanism. Based on the self-biasing mechanism, the sense amplifier can be configured to simultaneously (1) charge sensing nodes that are connected to digit lines and (2) compensate for the mismatches in the threshold voltages across one or more sets of transistors within the sense amplifier. Further, the sense amplifier can be configured to charge gut nodes based on voltages at a set of power nodes (e.g., ACT and RNL) and/or the sensing nodes, but without connecting to a dedicated precharging voltage (e.g., $V_{BLP}$).

In some embodiments, the sense amplifier can include a first power transistor and a second power transistor (e.g., a pair of p-type field-effect transistors (PFETs)) connected to a first power node (ACT). Opposite the first power node, the first and second power transistors can be connected to a first gut node and a second gut node, respectively. The first gut node can further include connections to a first isolation transistor (e.g., an n-type field-effect transistor (NFET)) and/or a control terminal (e.g., a gate) of the second power transistor. The second gut node can further include connections to a second isolation transistor (e.g., an NFET) and/or a control terminal of the first power transistor. Opposite the first and second gut nodes, the first isolation transistor can be connected to a first sensing node, and the second isolation transistor can be connected to a second sensing node. The first sensing node can be further connected to a first digit line (DL) and/or a third power transistor (e.g., an NFET), and the second sensing node can be further connected to a second digit line (DLb) and/or a fourth power transistor (e.g., an NFET). A control terminal of the third power transistor can be connected to the second gut node, and a control terminal of the fourth power transistor can be connected to the first gut node. Opposite the first and second sensing nodes, the third and fourth power transistors can be connected to a second power node (RNL). In some embodiments, the first and second gut nodes can be connected via an equalizing transistor (e.g., an NFET). In one or more embodiments, the first and second gut nodes can be isolated from a precharging voltage source (e.g., VBLP). In other words, the first and second gut nodes can be limited to the connections described above. Accordingly, in some embodiments, the sense amplifier can be without a precharging transistor which would connect the first and second gut nodes to the precharging voltage.

In some embodiments, the sense amplifier can be configured to simultaneously charge the first and second sensing nodes and compensate for the mismatches in the threshold voltages of a set of transistors (e.g., between the third and fourth power transistors). To do so, the sense amplifier can include operations in a first phase for transitioning the first and second power nodes from a low voltage level to a high voltage level. Accordingly, the sense amplifier can be configured to bias one or more of the power transistors, thereby charging the sensing nodes and/or the gut nodes. During the first phase, the first and second isolation transistors can be/remain deactivated and the equalizing transistor can be/remain activated. Accordingly, the voltage levels between the gut nodes can be even, while the voltage levels at the sensing nodes can be different from each other (e.g., due to the mismatch) and/or different from the voltage levels at the gut nodes. Afterwards (e.g., during a second phase), the isolation transistors can be activated, and the equalizing transistors can be deactivated. Further, one of the sensing nodes can be connected to a memory cell via the first digit line or the second digit line, and voltage levels at one or more of the power nodes can transition for operating the sense amplifier (e.g., for amplifying the voltage level of the connected memory cell).

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 140, and the selection of a bit line BL may be performed by a column decoder 145. Sense amplifiers (SAMP) 151 may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers 151 and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in the row decoder 140, the internal potentials $V_{OD}$ and $V_{ARY}$ can be used in the sense amplifiers included in the memory array 150, and the internal potential $V_{PERI}$ can be used in many other circuit blocks.

The power supply terminal may also be supplied with power supply potential $V_{DDQ}$. The power supply potential $V_{DDQ}$ can be supplied to the input/output circuit 160 together with the power supply potential $V_{SS}$. The power supply potential $V_{DDQ}$ can be the same potential as the power supply potential $V_{SS}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to memory device (e.g., over a networked connection or through intermediary devices).

The apparatus 100 can include an authentication circuit 180 configured to authenticate the operating environment of the apparatus 100. The authentication circuit 180 can be configured to authenticate devices (e.g., processor, SOC, etc.) interacting with the apparatus 100 and/or messages, data, etc. exchanged between the apparatus and the other devices. In some embodiments, the authentication circuit 180 can identify authentication commands received via the command/address input circuit 105 and/or the command decoder 115. The authentication circuit 180 can reset and begin counting/tracking targeted operating commands and/or duration after receiving and verifying the authentication command. The authentication circuit 180 can compare the tracked count/duration with a predetermined threshold. As described above, the authentication circuit 180 can reset the count/duration upon receiving a subsequent authentication command. When the count/duration matches or exceeds the predetermined threshold, the authentication circuit 180 can output a signal for reporting the erroneous status and/or for stopping operation of the apparatus 100. Details regarding the authentication process are described below.

In some examples, the plurality of sense amplifiers 151 may include threshold voltage compensation circuitry that compensates for threshold voltage (Vt) differences between components of the sense amplifiers 151. As circuit components become smaller, clock speeds become faster, and voltage/power consumption requirements are reduced. Small variances in the performance between circuit components of the sense amplifiers 151 (e.g., due to process, voltage, and temperature (PVT) variance) may reduce operational reliability of the apparatus 100. To mitigate effects of these variations, compensating for some of these threshold voltage differences may include, before activating the sense amplifier 151 to sense data, biasing digit lines (e.g., DL and DLb) coupled to the sense amplifiers 151 using internal nodes thereof that are configured to provide sensed data to an output (e.g., gut nodes). The bias of the digit lines may be based on threshold differences between at least two circuit components (e.g., transistors) of the sense amplifier 151. Compensating for threshold voltage Vt differences between circuit components within the sense amplifier 151 may improve reliability. As described in detail below, the apparatus 100 and/or the sense amplifiers 151 therein can be configured to implement the compensation operations simultaneously with precharging operations using a reduced number of components.

Figure 2:
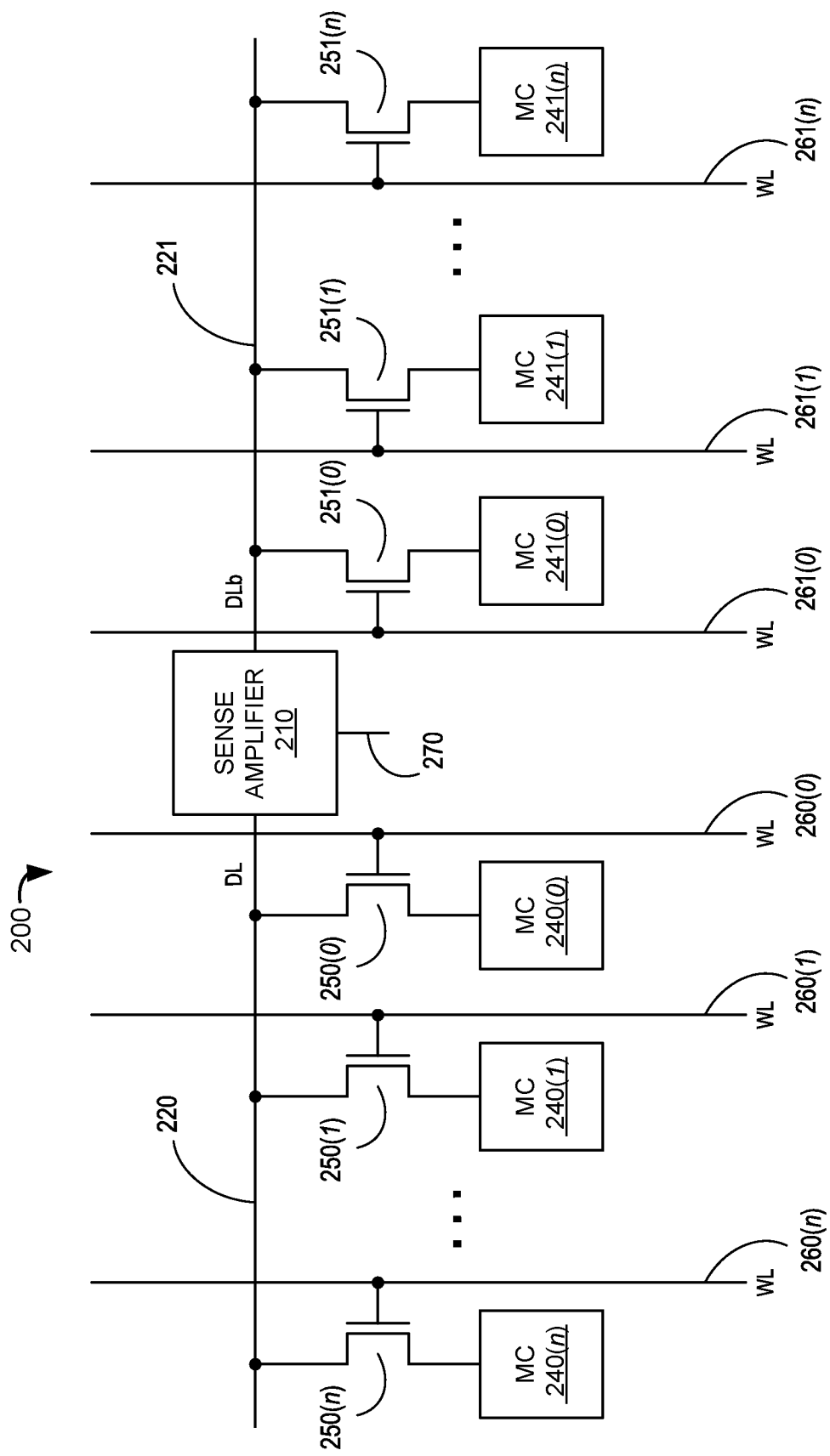
FIG. 2 is a schematic block diagram of an example sense amplifier connection in accordance with an embodiment of the present technology.

FIG. 2 is an example schematic block diagram of an example sense amplifier connection 200 in accordance with an embodiment of the present technology. In some embodiments, the apparatus 100 can include the sense amplifier connection 200 with a sense amplifier 210 (e.g., one of the sense amplifiers 151 of FIG. 1) coupled to a pair of complementary digit/bit lines DL 220 and DLb 221.

Memory cells 240(0)-(N) may be selectively coupled through respective access devices (e.g., transistors) 250(0)-(n) to the DL 220, and memory cells 241(0)-(N) may be selectively coupled through respective access devices (e.g., transistors) 251(0)-(N) to the DLb 221. One or more sets of word-lines WL 260(0)-(N) can be configured to control the access devices 250(0)-(N), thereby selectively connecting the memory cells 240(0)-(N) to the DL 220 through the corresponding access devices 250(0)-(N). For example, the word-lines WL 260(0)-(N) can be coupled to gates of corresponding transistors and provide control signals for operating the corresponding transistors. Similarly, word-lines WL 261(0)-(N) can control the corresponding access devices 251(0)-(N) to selectively connect the memory cells 241(0)-(N) to the DLb 221. The sense amplifier 210 may be controlled via control signals received via a decoder circuit, such as the command decoder 115 of FIG. 1, the row decoder 140 of FIG. 1, the column decoder 145 of FIG. 1, and/or control circuitry of the memory cell array 150.

In some embodiments, the memory 200 can operate according to phases or modes. For example, the memory 200 can operate according to a first phase (e.g., precharge phase) that is initiated in response to a precharge command PRE. During the precharge phase, the word-lines WL 260(0)-(N) and 261(0)-(N) may be set to an inactive state, and in response, the access devices 250(0)-(N) and 251(0)-(N) may be disabled. Further, the digit lines DL 220 and DLb 221 may be precharged to and held at a precharge voltage, such as a digit line precharge voltage $V_{BLP}$, until transitioning to a second phase. The sense amplifier 210 can include internal nodes that are configured to provide a sensed data state to an output (e.g., gut nodes). During the precharge phase, the internal nodes can also be held at the precharge voltage (e.g., at $V_{BLP}$) until transitioning to the second phase.

In some embodiments, the sense amplifier 210 can include a threshold voltage compensation circuitry configured to compensate for threshold voltage (Vt) mismatches between components of the sense amplifier 210 during a threshold voltage compensation phase. To perform the threshold voltage compensation, the sense amplifier 210 may, during a threshold voltage compensation phase, precharge or bias the digit lines DL 220 and DLb 221 using internal nodes such that a voltage difference between the digit line DL 220 and the DLb 221 is approximately equal to threshold voltage differences between at least two circuit components of the sense amplifier 210. In some examples, the threshold voltage difference may be based on threshold voltages of transistors of the sense amplifier 210. Compensating for Vt differences between circuit components within the sense amplifier 210 can improve reliability of the apparatus 100.

The memory 200 can operate according to a third phase (e.g., a sense amplifier activation phase) following the second phase. During the activation phase, one or more of the word-lines WL 260(0)-(N) and 261(0)-(N) may be set to an active state. In response, one or more of the access devices 250(0)-(N) and 251(0)-(N) may be enabled to couple a respective memory cell of the memory cells 240(0)-(N) and 241(0)-(N) to one of the digit lines DL 220 and DLb 221. The sense amplifier 210 may be configured to perform a sense operation to sense a data state of the coupled memory cell. That is, during a sense operation, a data state stored by the coupled memory cell is sensed and amplified by the sense amplifier 210 to drive one of the digit line DL 220 or the digit line DLb 221 to a high or low voltage level corresponding to the sensed data state. The sense amplifier 210 can drive the other digit line of the digit lines DL 220 and DLb 221 to the complementary voltage level during the sense operation. After the sense operation, the circuitry of the memory 200 may remain in the activation phase or may transition back to the precharge phase in response to a precharge command PRE. Similarly, one of the memory cells 241(0)-(N) can be coupled to the digit line DLb 221 through the respective access device 251(0)-(N) in response to a respective word-line 261(0)-(N) becoming active. A data state stored by the memory cell can be sensed and amplified by the sense amplifier 210 to drive the digit line DLb 221 to a high or low voltage level corresponding to the sensed data state. The other digit line DL 220 can be driven to the complementary voltage level (e.g., the high voltage level is complementary to the low voltage level and the low voltage level is complementary to the high voltage level) during the sense operation.

Figure 3A:
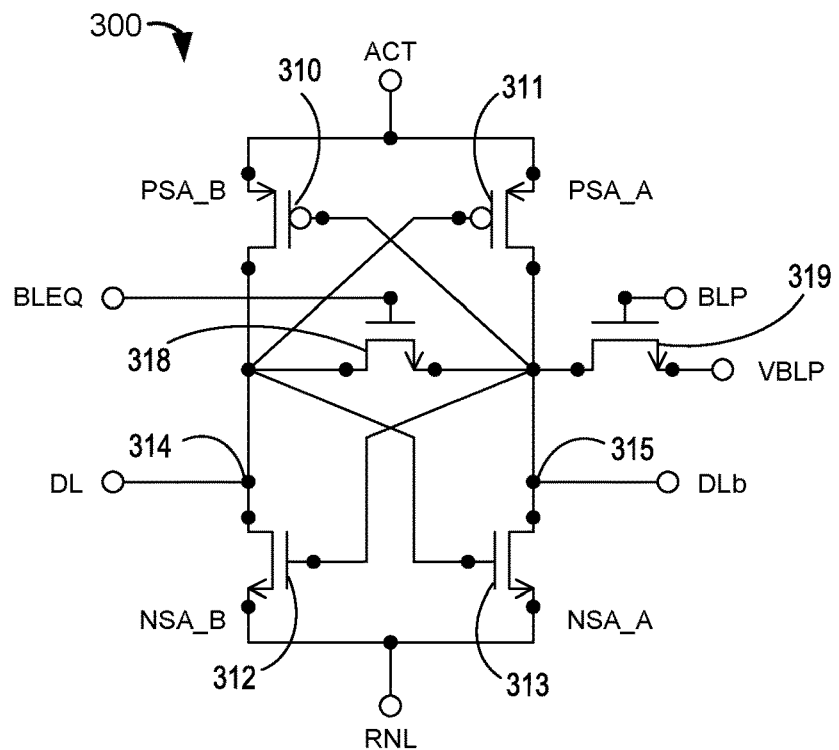
FIG. 3A is a schematic diagram of a first example sense amplifier in accordance with an embodiment of the present technology.

FIG. 3A is a schematic block diagram of a first example sense amplifier 300 ("sense amplifier 300") in accordance with an embodiment of the present technology. The sense amplifier 300 can correspond to the sense amplifier 210 of FIG. 2 and/or one of the sense amplifiers 151 of FIG. 1.

In some embodiments, the sense amplifier 300 can include a first set of transistors (e.g., p-type field effect transistors (PFETs)) 310 and 311, each having a first terminal (e.g., drains) coupled to nodes 314 and 315, respectively. The sense amplifier 300 can further include a second set of transistors (e.g., n-type field effect transistors (NFETs)) 312 and 313, each having a first terminal (e.g., drains) coupled to the nodes 314 and 315, respectively. In one or more embodiments, the nodes 314 and 315 may be called "gut nodes" in a non-limiting manner. Second terminals (e.g., respective gates) of the transistors 310 and 312 can be coupled to the node 315 and second terminals (e.g., respective gates) of the transistors 311 and 313 can be coupled to the node 314. Third terminals (e.g., sources) of the transistors 310 and 311 can be coupled to a first power supply node ACT, and third terminals (e.g., sources) of the transistors 312 and 313 can be coupled to a second power supply node RNL. The first terminals (e.g., the drains) of transistors 312 and 313 can be coupled to sense nodes 314 and 315, respectively. A digit line DL can be coupled to the node 314, and a digit line DLb can be coupled to the node 315. In some embodiments, the digit line DL can correspond to the digit line DL 220 of FIG. 2 and the digit line DLb can correspond to the digit line DLb 221 of FIG. 2.

In some embodiments, the sense amplifier 300 can include a transistor 318 (e.g., an NFET) having a first terminal (e.g., a drain) and a second terminal (e.g., a source) coupled to the nodes 314 and 315, respectively. The sense amplifier 300 can further include a precharge transistor 319 (e.g., an NFET) coupled to the node 315. The transistor 319 can have a first terminal (e.g., a drain) coupled to the nodes 314 and/or 315. The transistor 319 can be configured to provide a voltage $V_{BLP}$ from a second terminal (e.g., a source) to the connected nodes (e.g., the nodes 314 and/or 315) when activated by an active control signal BLP (e.g., high logic level). In some embodiments, the voltage $V_{BLP}$ can be provided to the node 315 when the transistor 319 is active. When activated by an active control signal BLEQ (e.g., high logic level), the transistor 318 can provide a conductive path between the nodes 314 and 315, thereby equalizing the respective node voltages. In some embodiments of the disclosure, the voltage $V_{BLP}$ can be 0.4V.

For illustrative purposes, the transistors 310 and 311 are shown as PFETs, and the transistors 312, 313, 318, and 319 are shown as NFETs in FIG. 3A. However, it is understood that one or more of the transistors can be a different type, connected to a different transistor, and/or connected to a different circuit without departing from the scope of the disclosure.

Figure 3B:
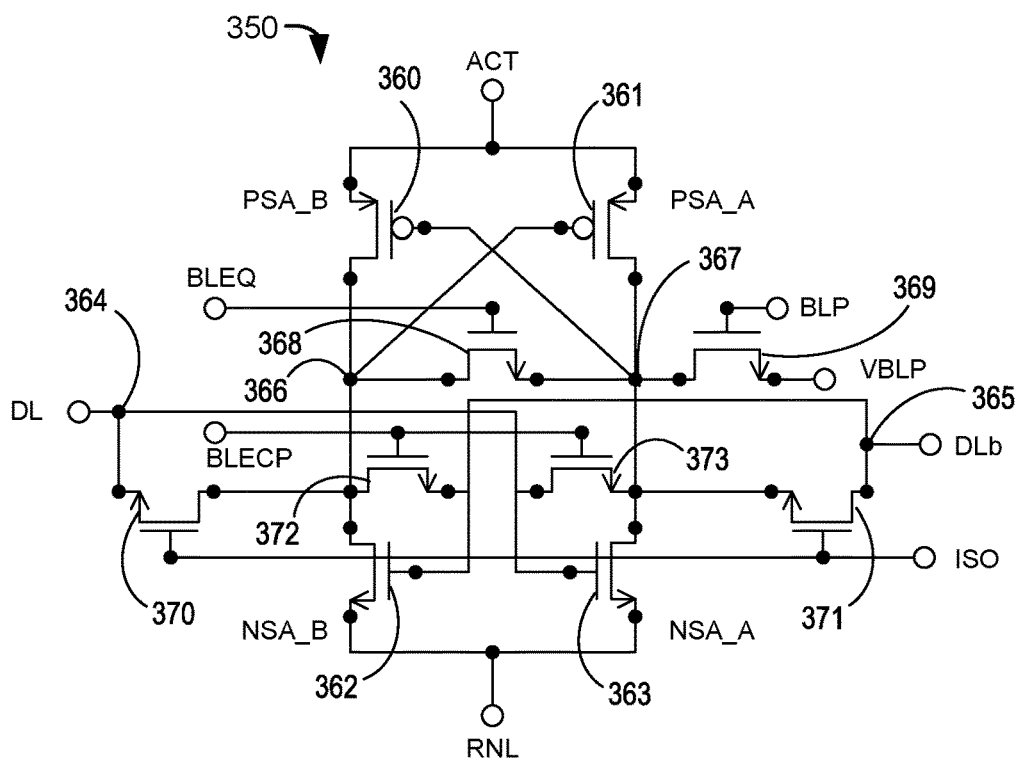
FIG. 3B is a schematic diagram of a second example sense amplifier in accordance with an embodiment of the present technology.

FIG. 3B is a schematic block diagram of a second example sense amplifier 350 ("sense amplifier 350") in accordance with an embodiment of the present technology. The sense amplifier 350 can correspond to the sense amplifier 210 of FIG. 2 and/or one of the sense amplifiers 151 of FIG. 1. The sense amplifier 350 can be similar to the sense amplifier 300 of FIG. 3A. For example, the sense amplifier 350 can include a first set of transistors (e.g., p-type field effect transistors (PFETs)) 360 and 361, each having a terminal (e.g., drains) coupled to nodes 366 and 367, respectively. The sense amplifier 350 can further include a second set of transistors (e.g., n-type field effect transistors (NFETs)) 362 and 363, each having a terminal (e.g., drains) coupled to the nodes 366 and 367, respectively. In one or more embodiments, the nodes 366 and 367 may be called "gut nodes" in a non-limiting manner. Second terminals (e.g., respective gates) of the transistors 360 and 361 can be coupled to the nodes 367 and 368, respectively. Third terminals (e.g., sources) of the transistors 360 and 361 can be coupled to a first power supply node ACT, and third terminals (e.g., sources) of the transistors 362 and 363 can be coupled to a second power supply node RNL. The first terminals (e.g., the drains) of transistors 362 and 363 can be coupled to the nodes 366 and 367, respectively.

In some embodiments, the sense amplifier 350 can include circuitry configured to mitigate the Vt mismatch that may be introduced due to process mismatch. For example, the sense amplifier 350 can include a first set of transistors (e.g., NFETs) 370 and 371 and a second set of transistors (e.g., NFETs) 372 and 373 that are coupled to the nodes 366 and 367. In one or more embodiments, the first and second sets of transistors 370-373 can be cross coupled. For example, first terminals (e.g., drains) of the transistors 370 and 372 can be coupled to the node 366. Second terminals (e.g., sources) of the transistors 371 and 373 can be coupled to the node 367. One or more of the terminals for the first set of sense transistors 370 and 371 and the second set of sense transistors 372 and 373 can be coupled to sense nodes 364 and 365. For example, a second terminal (e.g., a source) of the transistor 370 can be coupled to the node 364, and a first terminal (e.g., a drain) of the transistor 371 can be coupled to the node 365. Third terminals (e.g., gates) of the transistors 370 and 371 can be coupled to a control signal ISO that changes active/inactive states thereof. Also, a second terminal (a source) of the transistor 372, along with a terminal (e.g., a gate) of the transistor 362 can be coupled to the node 365. A first terminal (a drain) of the transistor 373, along with a terminal (e.g., a gate) of the transistor 363 can be coupled to the node 364. Third terminals (e.g., gates) of the transistors 372 and 373 can be connected to a control signal BLECP that changes active/inactive states thereof. Further, a digit line DL (e.g., the digit line DL 220 of FIG. 2) can be coupled to the node 364 and a digit line DLb (e.g., the digit line DLb 221 of FIG. 2) can be coupled to the node 365. Accordingly, the sense amplifier 350 can be configured for sampling the Vt at a set of terminals (e.g., the drains) of the first and second sets of transistors 370-373 that correspond to the digit lines DL and DLb.

In some embodiments, the sense amplifier 350 can include a transistor 368 (e.g., an NFET) having a first terminal (e.g., a drain) and a second terminal (e.g., a source) coupled to the nodes 366 and 367, respectively. The sense amplifier 350 can further include a precharge transistor 369 (e.g., an NFET) coupled to the node 367. The transistor 369 can have a first terminal (e.g., a drain) coupled to the nodes 366 and/or 367. The transistor 369 can be configured to provide a voltage $V_{BLP}$ from a second terminal (e.g., a source) to the connected nodes (e.g., the nodes 366 and/or 367) when activated by an active control signal BLP (e.g., high logic level). In some embodiments, the voltage $V_{BLP}$ can be provided to the node 367 when the transistor 369 is active. When activated by an active control signal BLEQ (e.g., high logic level), the transistor 368 can provide a conductive path between the nodes 366 and 367, thereby equalizing the respective node voltages. In some embodiments of the disclosure, the voltage $V_{BLP}$ can be 0.4V.

For illustrative purposes, the transistors 360 and 361 are shown as PFETs and the transistors 362, 363, 368, 369, 370, 371, 372, and 373 are shown as NFETs in FIG. 3B. However, it is understood that one or more of the transistors can be a different type, connected to a different transistor, and/or connected to a different circuit without departing from the scope of the disclosure.

Figure 3C:
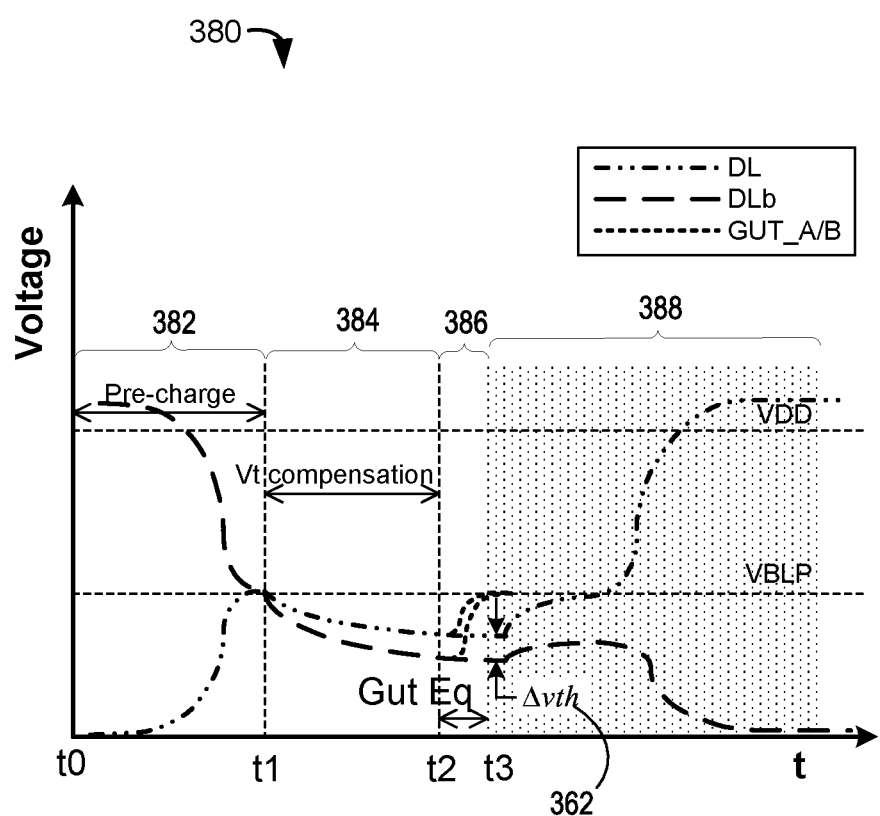
FIG. 3C is a timing diagram for the second example sense amplifier of FIG. 3B in accordance with an embodiment of the present technology.

FIG. 3C is a timing diagram 380 for the second example sense amplifier 350 of FIG. 3B in accordance with an embodiment of the present technology. The timing diagram 380 can further illustrate voltages at various portions in the sense amplifier 350, such as for the nodes 364 and 365 of FIG. 3B (e.g., the digit lines DL and DLb) and/or for the nodes 364 and 365 of FIG. 3B (e.g., the gut nodes A and/or B). The timing diagram 380 can further illustrate different phases that may occur during operation of the sense amplifier 350, including the mitigation of the Vt mismatch. For example, the operation of the sense amplifier 350 can include a first phase 382, a second phase 384, a third phase 386, and/or a fourth phase 388.

In some embodiments, the first phase 382 (e.g., between t0 and t1) can correspond to a precharge phase. Prior to and/or at an initial portion (e.g., at t0) of the first phase 382, the digit lines DL and DLB can be at complementary levels. For example, one of the digit lines can be at a high voltage level (e.g., $V_{ARY}$ or $V_{DD}$) and the other of the digit lines can be at a low voltage level (e.g., $V_{SS}$ or ground) at the initial portion. Also prior to and/or at an initial portion (e.g., at t0) of the first phase 382, the power supply node ACT can be at a high voltage level, and the power supply node RNL can be at a low voltage level. In one or more embodiments, the voltage $V_{ARY}$ may be 1.0V.

During the first phase 382 (e.g., at or after t0), the transistor 369 of FIG. 3B can be activated via an active control signal BLP to provide a voltage $V_{BLP}$ to node 367 of FIG. 3B. The control signal BLEQ can activate the transistor 368 to form a conductive path between the nodes 366 and 367. Thus, according to the BLEQ signal, the nodes 366 and 367 can have the same voltage levels (e.g., $V_{BLP}$). In some embodiments, the control signal ISO can activate the transistors 370 and 371 of FIG. 3B, thereby electrically connecting the nodes 364 and 365 to the nodes 366 and 367, respectively. Accordingly, the nodes 364 and 365 can have the same voltage level as the nodes 366 and 367, as illustrated by overlaps in the traces for the DL and DLb voltage levels with voltage levels for gut nodes A and B, respectively.

Following time T0, a voltage provided to the power supply node ACT can change from the high voltage level to the $V_{BLP}$ voltage and a voltage provided to the power supply node RNL can change from the low voltage level to the high voltage level (e.g., $V_{ARY}$). As a result, by time T1, the digit lines DL and DLb (which are coupled to nodes 364 and 365, respectively) can change from complementary voltage levels to the $V_{BLP}$. Additionally, a set of terminals (e.g., the gate and the drain) of the transistor 362 can be coupled together and a set of terminals (e.g., the gate and the drain) of the transistor 363 can be coupled together. Accordingly, the transistors 362 and 363 can effectively be diode coupled.

In some embodiments, the second phase 384 (e.g., between t1 and t2) can correspond to a Vt compensation phase. During the second phase 384, the transistor 369 can be deactivated according to the BLP signal, thus no longer providing the voltage $V_{BLP}$ to the node 367. The control signal ISO can also deactivate the transistors 370 and 371 to no longer provide a conductive path between the sense nodes 364 and 365 and the nodes 366 and 367, respectively. Also, following time T1, the voltage provided to the power supply node ACT can change from the voltage $V_{BLP}$ to the high voltage level (e.g., $V_{ARY}$). As a result, the nodes 364 and 365 can be isolated from the nodes 366 and 367. Additionally, the voltage at the nodes 366 and 367 can change based on the $V_{ARY}$ voltage being provided to the power supply node ACT and the transistor 369 no longer providing the voltage $V_{BLP}$ to the node 367. The voltage of the nodes 366 and 367 can change to $V_{ARY}$–vth0' due to a voltage drop across the transistors 360 and 361. The value 'vth0' can correspond to the threshold voltage of the transistors 360 and 361. It is assumed for the example that a threshold voltage vth0 of the transistors 360 and 361 is greater than a threshold voltage vth1 of the transistor 368. In some embodiments of the disclosure, the threshold voltage vth0 can be 0.25V.

In some embodiments, the Vt mismatches resulting from process, voltage, and/or temperature (PVT) can cause a difference between the respective voltages at nodes 364 and 365. With the power supply node RNL at the high voltage level (e.g., $V_{ARY}$), the voltage at the node 364 can be the gate voltage less the threshold voltage of the transistor 362 (vth). Similarly, the voltage at the node 365 can be the gate voltage less the threshold voltage of the transistor 363 (vth+Δvth). The resulting voltage at node 364 can be represented as '($V_{ARY}$–vth0)–vth' and the resulting voltage at node 365 can be represented as '($V_{ARY}$–vth0)–(vth+Δvth)'. The voltage at the node 364 may be rewritten as $V_{ARY}$–vth0–vth' and the voltage at node 365 may be rewritten as $V_{ARY}$–vth0–vth–Δvth'. The resulting voltages at the nodes 364 and 365 can causes the voltages of the digit lines DL and DLb, respectively, to change. For the example illustrated in FIG. 3C, the voltage of digit line DL is greater than the voltage of digit line DLb (e.g., the voltage of node 364 is greater than the voltage of node 365) by the voltage difference of nodes 364 and 365 'Δvth'. The difference between the respective voltages of nodes 364 and 365 (e.g., Δvth) can represent a threshold voltage offset between the threshold voltages of the transistors 362 and 363. By causing the respective voltages at nodes 364 and 365, threshold voltage compensation (e.g., for the transistors 362 and 363) may be provided.

In some embodiments, the third phase 386 (e.g., between t2 and t3) can correspond to an equalization phase. Following time T2, the transistor 369 may be activated to provide the voltage $V_{BLP}$ to the node 367. The voltage provided to the power supply node ACT may also change from the high voltage level to the voltage $V_{BLP}$. With the transistor 368 still activated to provide a conductive path between nodes 366 and 367, the voltage at nodes 366 and 367 may change to the voltage $V_{BLP}$ by time T3. The respective voltages at nodes 364 and 365 can be independent of the change in voltage at nodes 366 and 367. Thus, the difference in respective voltages remains at nodes 366 and 367 for threshold voltage compensation.

In some embodiments, the fourth phase 388 (e.g., after t3) can correspond to an operational phase. Effectively, the sense amplifier 350 can be coupled to a memory cell (e.g., one of the memory cells illustrated in FIG. 2) via the digit line DL or DLb to read the information stored in the connecting memory cell. The memory cell coupled to the digit line can cause a voltage change on the respective digit line based on the state (e.g., the stored charges) of the connected memory cell. The sense amplifier 350 can determine the voltage change, thereby reading the information stored in the connecting memory cell.

Figure 4A:
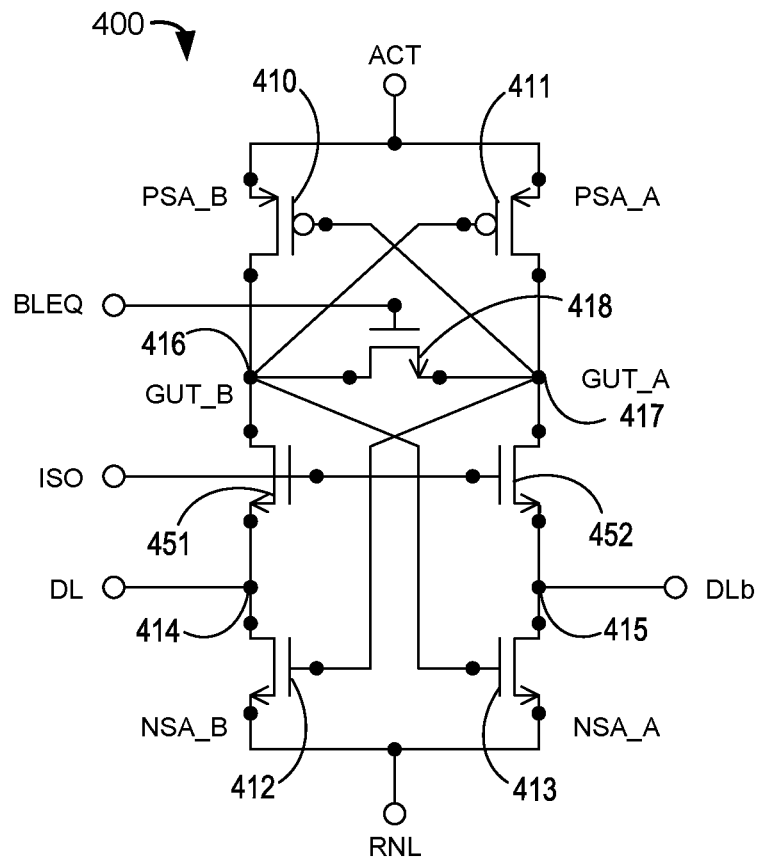
FIG. 4A is a schematic block diagram of a third example sense amplifier in accordance with an embodiment of the present technology.

FIG. 4A is a schematic block diagram of a third example sense amplifier 400 in accordance with an embodiment of the present technology. The sense amplifier 400 can correspond to the sense amplifier 210 of FIG. 2 and/or one of the sense amplifiers 151 of FIG. 1.

In some embodiments, the sense amplifier 400 can include a first set of transistors (e.g., p-type field effect transistors (PFETs)) 410 and 411, each having a first terminal (e.g., drains) coupled to nodes 416 and 417 (e.g., gut nodes), respectively. The sense amplifier 400 can further include a second set of transistors (e.g., n-type field effect transistors (NFETs)) 412 and 413, each having a first terminal (e.g., drains) coupled to sense nodes 414 and 415, respectively. Second terminals (e.g., respective gates) of the transistors 410 and 412 can be coupled to the node 417, and second terminals (e.g., respective gates) of the transistors 411 and 413 can be coupled to the node 416. Third terminals (e.g., sources) of the transistors 410 and 411 can be coupled to a first power supply node ACT, and third terminals (e.g., sources) of the transistors 412 and 413 can be coupled to a second power supply node RNL. The first terminals (e.g., the drains) of the transistors 412 and 413 can be coupled to the nodes 414 and 415, respectively. A digit line DL can be coupled to the node 414, and a digit line DLb can be coupled to the node 415. In some embodiments, the digit line DL can correspond to the digit line DL 220 of FIG. 2 and the digit line DLb can correspond to the digit line DLb 221 of FIG. 2.

The nodes 416 and 417 can be connected to the nodes 414 and 415 through a third set of transistors (e.g., NFETs) 451 and 452, all respectively. For example, first terminals (e.g., sources) of the transistors 451 and 452 can be coupled to the nodes 414 and 415, respectively. Also, second terminals (e.g., drains) can be coupled to the nodes 416 and 417, respectively. Third terminals (e.g., gates) of the transistors 451 and 452 can be coupled to control signal ISO. In some embodiments, the sense amplifier 400 can include a transistor 418 (e.g., an NFET) having a first terminal (e.g., a drain) and a second terminal (e.g., a source) coupled to the nodes 416 and 417, respectively. When activated by an active control signal BLEQ (e.g., high logic level), the transistor 418 can provide a conductive path between the nodes 414 and 415, thereby equalizing the respective node voltages.

The sense amplifier 400 can be without a precharge transistor (e.g., the transistor 319 of FIG. 3A and/or the transistor 369 of FIG. 3B). In other words, the nodes 416 and/or 417 of the sense amplifier 400 can be independent of or isolated from a separate voltage source, such as a voltage $V_{BLP}$. Accordingly, the sense amplifier 400 can equalize the voltages at the nodes 416 and/or 417 based on a connection through the transistor 418 and/or without connecting to a different node/source. As described in detail below, the apparatus 100 and/or the sense amplifier 400 can be configured to precharge the nodes 416 and/or 417 based on voltages at the power nodes (e.g., the ACT node and/or the RNL node), thereby combining or simultaneously implementing precharging operations and threshold voltage compensations.

The sense amplifier 400 can provide threshold voltage compensation while reducing/minimizing the circuit size and complexity, thereby providing advantages over other sense amplifiers. For example, the sense amplifier 400 may include fewer circuit components (e.g., transistors) in comparison to the sense amplifier 350 of FIG. 3B. Further, the sense amplifier 400 can be configured to provide threshold voltage compensation, which may be unavailable for the sense amplifier 300 of FIG. 3A, with minimal increase (e.g., two additional transistors) in the number of circuit components. As a result, the sense amplifier 400 can occupy a smaller space within the apparatus 100. Also, the reduced number of circuit components can provide reduced circuit complexity, which can lead to a decrease in the number of manufacturing errors/defects and/or a reduction in the resources needed to validate the apparatus 100.

For illustrative purposes, the transistors 410 and 411 are shown as PFETs and the transistors 412, 413, 418, 451, and 452 are shown as NFETs in FIG. 4A. However, it is understood that one or more of the transistors can be a different type, connected to a different transistor, and/or connected to a different circuit without departing from the scope of the disclosure.

Figure 4B:
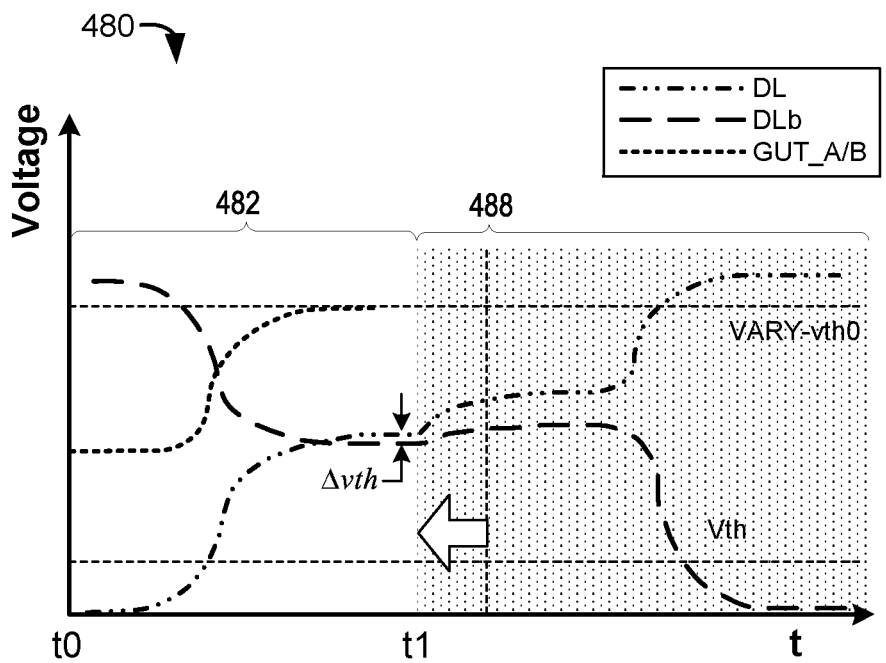
FIG. 4B is a timing diagram for the third example sense amplifier of FIG. 4A in accordance with an embodiment of the present technology.

FIG. 4B is a timing diagram 480 for the third example sense amplifier of FIG. 4A in accordance with an embodiment of the present technology. The timing diagram 480 can further illustrate voltages at various portions in the sense amplifier 400, such as for the nodes 414 and 415 of FIG. 4A (e.g., the digit lines DL and DLb) and/or for the nodes 414 and 415 of FIG. 4A (e.g., the gut nodes A and/or B). The timing diagram 480 can further illustrate different phases/states that may occur during operation of the sense amplifier 400, including the mitigation of the Vt mismatch. For example, the operation of the sense amplifier 400 can include a first phase 482 and/or a second phase 488.

In some embodiments, the first phase 482 (e.g., between t0 and t1) can correspond to an initial phase that effectively combines a precharge phase (e.g., the first phase of 382 of FIG. 3C), a Vt compensation phase (e.g., the second phase 384 of FIG. 3C), and/or an equalization phase (e.g., the third phase 386 of FIG. 3C) for equalizing the voltages at the gut nodes A and B (e.g., the nodes 416 and 417 of FIG. 4A). In comparison to the sense amplifier 350 of FIG. 3B and the corresponding timing diagram 380 of FIG. 3C, the sense amplifier 400 can operate (e.g., equalize the gut voltages) without relying on an additional transistor (e.g., the transistor 319 of FIG. 3A and/or the transistor 369 of FIG. 3B) that connects the gut nodes to an external supply voltage (e.g., $V_{BLP}$). Accordingly, the equalization of the gut node voltages can be combined with (e.g., concurrently with) the precharging operation and/or the Vt compensation operation. In some embodiments, the compensation operation can replace the precharging operation, and the sense amplifier 400 can be configured to self-bias, thereby reducing/eliminating the equalization phase.

The second phase 488 (e.g., after t1) can correspond to an operational phase. Effectively, the sense amplifier 400 can be coupled to a memory cell (e.g., one of the memory cells illustrated in FIG. 2) via the digit line DL or DLb to read the information stored in the connecting memory cell. The memory cell coupled to the digit line can cause a voltage change on the respective digit line based on the state (e.g., the stored charges) of the connected memory cell. The sense amplifier 400 can determine the voltage change, thereby reading the information stored in the connecting memory cell. Details regarding the operations of the sense amplifier 400 during the first phase 482 and the second phase 488 are described below.

The concurrent implementation of the equalization with other operations provides reduced setup time for the sense amplifier 400 to read the memory cells. Further, by eliminating transistors that connect to external sources and reducing the total number of components, the sense amplifier 400 can reduce the number of operated components. Accordingly, the sense amplifier 400 can provide reduced runtime error.

Figure 5A:
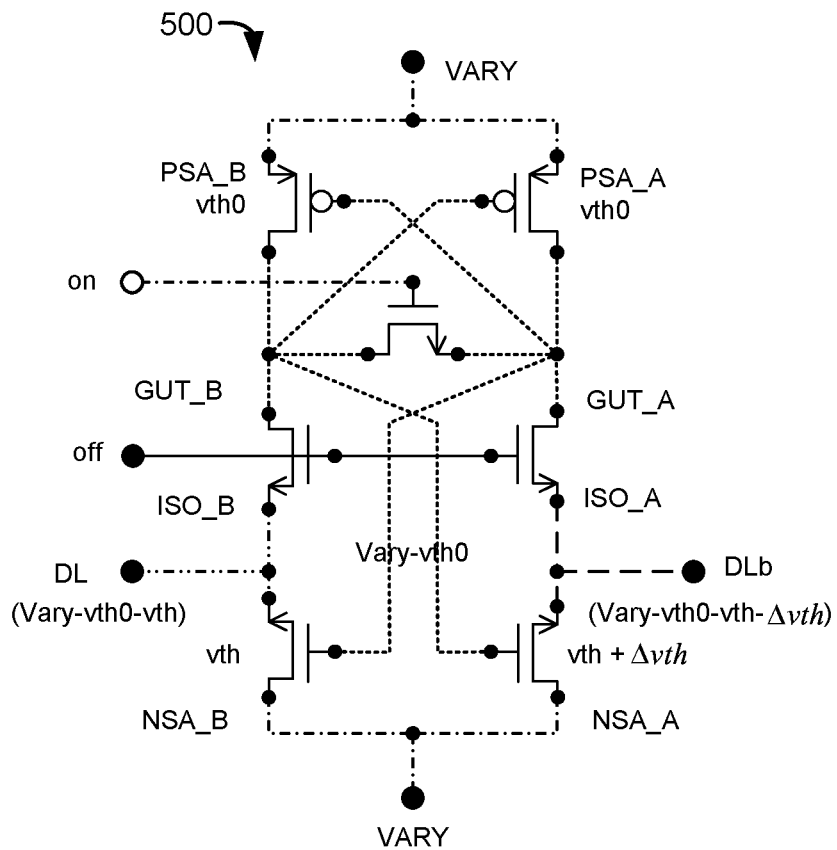
FIG. 5A is a schematic block diagram of a first state for the third example sense amplifier of FIG. 4A in accordance with an embodiment of the present technology.
Figure 5B:
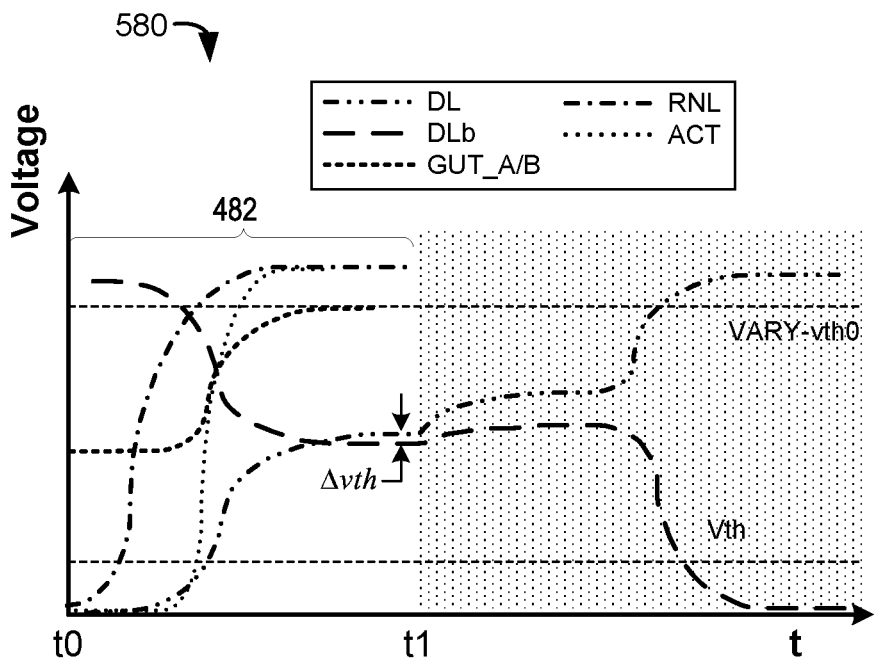
FIG. 5B is a timing diagram for the first state in accordance with an embodiment of the present technology.

For illustrating the first phase 482 (e.g., between t0 and t1 of FIG. 4B), FIG. 5A is a schematic block diagram of a first state 500 for the sense amplifier 400 of FIG. 4A, and FIG. 5B is a timing diagram 580 for the first state 500, both in accordance with an embodiment of the present technology. Referring to FIG. 4A, FIG. 5A, and FIG. 5B together, the first state 500 and the timing diagram 580 can illustrate voltages at various portions within the sense amplifier 400 during the first phase 482. For example, at and/or before t0, voltages at the first power supply node ACT and the second power supply node RNL can be at a similar/matching level. In some embodiments, the voltages at the first power supply node ACT and the second power supply node RNL can be at a low level at and/or before t0. Also, at and/or before t0, the nodes 414 and 415 can be at complementary levels. As illustrated in FIG. 5B, the node 414 corresponding to the digit line DL can be at a low level, and the node 415 corresponding to the digit line DLb can be at a high level.

Further, the voltages at the gut nodes can be independent of or separate from the voltages at the node 414, the node 415, the first power supply node ACT, and/or the second power supply node RNL at and/or before t0. Before t0 (e.g., at the end of a previous operation), the gut nodes can be at complementary levels. For example, one of the nodes 416 and 417 can be at $V_{ARY}$ and the other can be at a lower voltage (e.g., $V_{SS}$).

At t0, the transistor 418 can be activated, thereby equalizing the gut nodes (e.g., causing the nodes 416 and 417 to be at similar/matching levels, such as at $\frac{1}{2}V_{ARY}$). As illustrated in FIG. 5B, for example, the voltages at the nodes 416 and/or 417 can be at an intermediate level between the high and low levels (e.g., between $V_{ARY}$-vth0 and vth). The transistors 410, 411, 451, and/or 452 can be inactive, thereby isolating the gut nodes from one or more of the bit lines and/or from one or more of the power supply nodes.

After t0, the control signal ISO can control the transistors 451 and 452 to be/remain inactive or off, thereby isolating the node 416 from the node 414 and isolating the node 417 from the node 415. Further, the first power supply node ACT and/or the second power supply node RNL can transition to a high level (e.g., $V_{ARY}$). In some embodiments, the second power supply node RNL can transition before the first power supply node ACT. As the second power supply node RNL transitions, voltages at the nodes 414 and 415 can further increase, such as based on biasing the transistors 412 and 413. The resulting voltage at the node 414 can be represented as $V_{ARY}$-vth0-vth and the resulting voltage at the node 415 can be represented as $V_{ARY}$-vth0-vth-Δvth. The voltage drop across the transistor 412 can be represented as vth, and the voltage drop across for the transistor 413 can be represented as vth-Δvth with Δvth representing the Vt mismatch between transistors 412 and 413. In some embodiments, the DL pre-charge level can be about 0.54V (i.e., 1.0-0.23-0.23 for $V_{ARY}$-vth0-vth), and the difference in the precharging voltage levels at bit lines DL and DLb can be represented as Δvth. In some embodiments, the apparatus 100 and/or the sense amplifier 400 can effectively sample the Vt of the transistors 412 and 413, such as through the digit lines DL and DLb corresponding to the nodes 414 and 415, respectively. Accordingly, the apparatus 100 and/or the sense amplifier 400 can determine the mismatch of Vt (i.e., Δvth) between the transistors 412 and 413.

When the first power supply node ACT transitions to the high voltage level, voltages at the nodes 416 and 417 can similarly increase based on biasing the transistors 410 and 411. The voltages at the nodes 416 and 417 can be represented as $V_{ARY}$–vth0, and vth0 can represent the voltage drop across the transistor 410 and/or 411. Accordingly, voltages at the control terminals (e.g., the gates) of transistors 410, 411, 412, and/or 413 can increase to $V_{ARY}$–vth0.

Figure 6A:
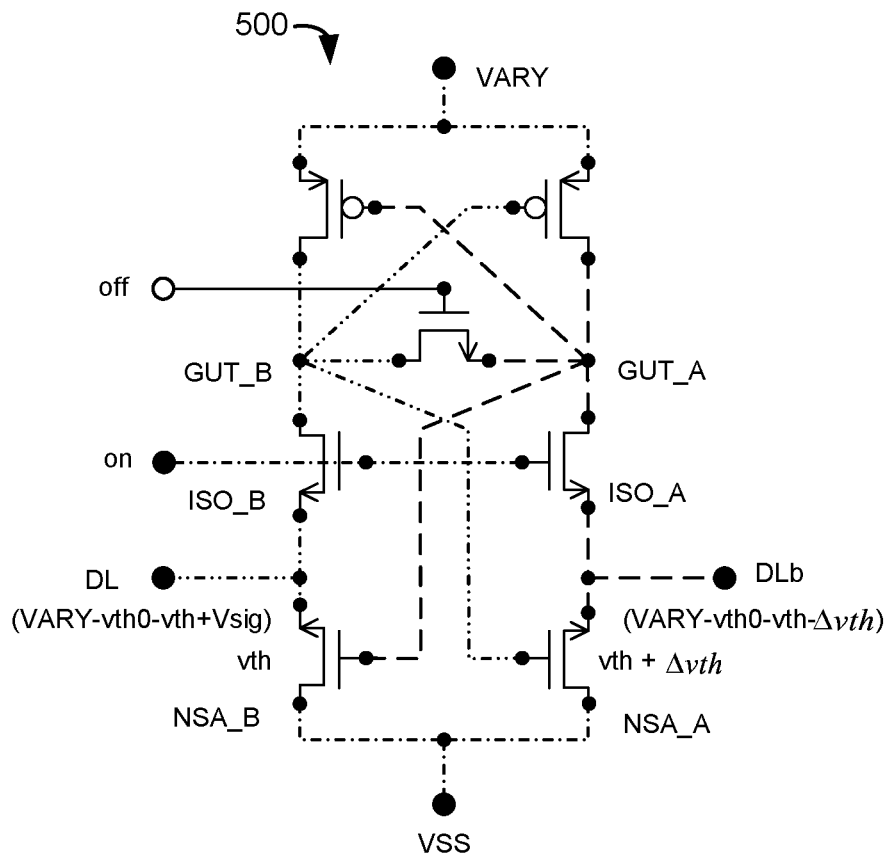
FIG. 6A is a schematic block diagram of a second state for the third example sense amplifier of FIG. 4A in accordance with an embodiment of the present technology.
Figure 6B:
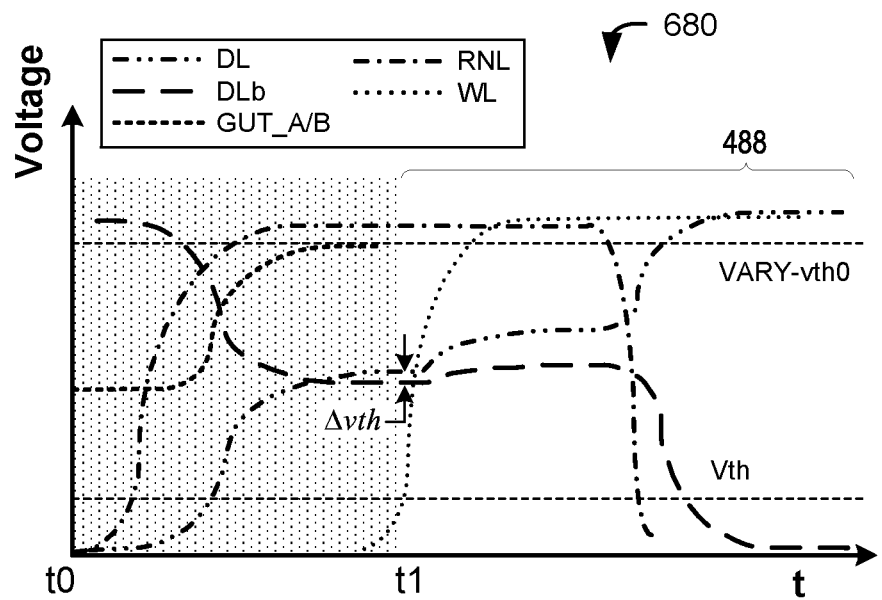
FIG. 6B is a timing diagram for the second state in accordance with an embodiment of the present technology.

In illustrating the second phase 488, FIG. 6A is a schematic block diagram of a second state 600 for the sense amplifier 400 of FIG. 4A, and FIG. 6B is a timing diagram 680 for the second state 600, both in accordance with an embodiment of the present technology. Referring to FIG. 4A, FIG. 6A, and FIG. 6B together, the voltage at the second power supply node RNL can transition to a low voltage level (e.g., $V_{SS}$) and/or the voltage at the first power supply node ACT can remain at a high voltage level (e.g., $V_{ARY}$) in preparation for sense amplifier activation mode. Also, around t1, a targeted word-line can be activated, thereby connecting a corresponding memory cell to the sense amplifier 400 through the digit line DL or DLb. For the example illustrated in FIG. 6B, the voltage at the digit line DL (e.g., node 414) can increase according to the connected memory cell.

Also, after t1, the control signal BLEQ can transition, thereby deactivating the transistor 418 and disconnecting the nodes 416 and 417. Further the control signal ISO can activate the transistors 451 and 452, thereby connecting the node 416 to the node 414 and connecting the node 417 to the node 415. Accordingly, the voltage at the digit line DL (e.g., node 414) increases by Vsig. The resulting voltage at the node 414 can be represented as $V_{ARY}$ vth0–vth+$V_{sig}$. The voltage at the node 415 can be remain at $V_{ARY}$ vth0–vth+Δvth. The following equations describe voltages across various terminals (e.g., across gate and source (Vgs) and/or across drain and source (Vds)) of transistors 412 and 413.

$$NSA_A: Vgs - Vth_A = (V_{ARY} - vth0 - vth + Vsig) - \quad \text{Equation (1)}$$
$$(vth + \Delta vth) + \Delta V$$
$$= V_{ARY} - vth0 - 2vth - \Delta vth +$$
$$Vsig + \Delta V.$$

$$NSA_A: Vds = V_{ARY} - vth0 - vth - \Delta vth \text{ (saturation)}. \quad \text{Equation (2)}$$

$$NSA_B: Vgs - Vth_B = (V_{ARY} - vth0 - vth - \Delta vth) - (vth) + \Delta V \quad \text{Equation (3)}$$
$$= V_{ARY} - vth0 - 2vth - \Delta vth + \Delta V$$
$$= \text{around 2.8 V (strong inversion)}.$$

$$NSA_B: Vds = V_{ARY} - vth0 - vth + Vsig \text{ (saturation)}. \quad \text{Equation (4)}$$

$$\Delta V = \frac{Q}{C} = \frac{C_{gut} * (V_{ary} - V_{vth0})}{C_{DL} + C_{gut}}. \quad \text{Equation (5)}$$

As described above, eliminating the biasing transistor (e.g., the transistor 319 of FIG. 3A and/or the transistor 369 of FIG. 3B) and the associated external power source can configure the sense amplifier 400 for self-biasing. Accordingly, the processes described above allow for the sense amplifier 400 to replace the precharging phase (e.g., the precharging phase 382 of FIG. 3C) with the compensation phase, such as for the first phase 482 of FIG. 4B. As a result of replacing the precharging phase and reducing the associated duration, additional time can be assigned to a compensation period to increase the compensation rate, thereby reducing the tRCD for the sense amplifier operations.

Figure 7:
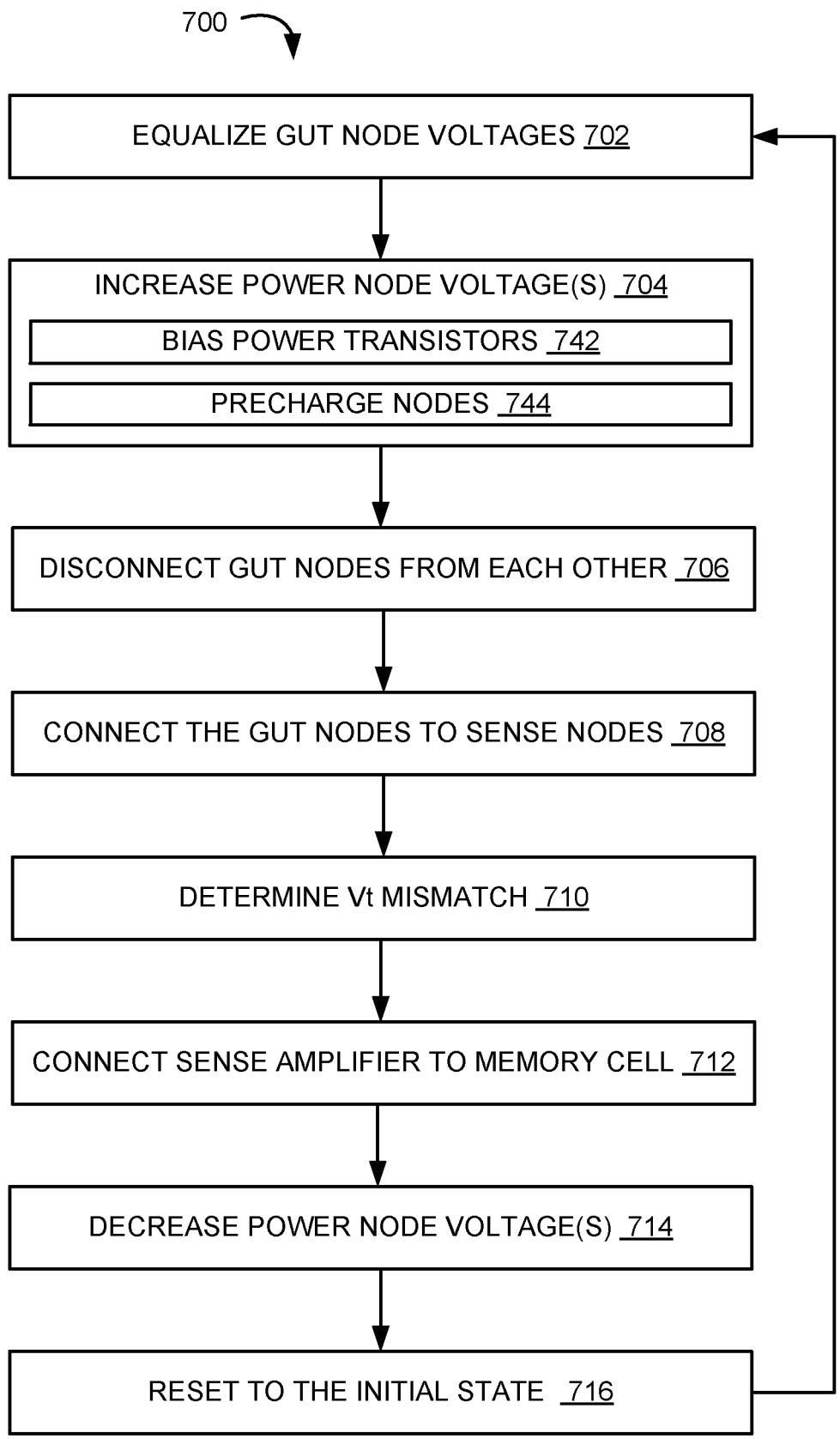
FIG. 7 is a flow diagram illustrating an example method of operating an apparatus in accordance with an embodiment of the present technology.

FIG. 7 is a flow diagram illustrating an example method of operating an apparatus (e.g., the apparatus 100 of FIG. 1) in accordance with an embodiment of the present technology. For example, the method 800 can be for operating the sense amplifier 151 of FIG. 1, the sense amplifier 210 of FIG. 2, and/or the sense amplifier 400 of FIG. 4A as described above. The method 800 can be for simultaneously precharging one or more nodes within the apparatus (e.g., the nodes 414, 415, 416, and/or 417 of FIG. 4A) and compensating for Vt mismatches. For example, the method 800 can be for implementing the first phase 482 and the second phase 488 illustrated in FIG. 4B.

As described above, the initial state (e.g., prior to t0 illustrated in FIG. 4B) of the sense amplifier 400 can correspond to an end of the preceding operation (e.g., the end of the second phase 488). Accordingly, the gut nodes (e.g., nodes 416 and 417) can be decoupled from each other, such as by deactivating the equalizing transistor (e.g., the transistor 418 of FIG. 4A) that is directly connected between the gut nodes. Further, the gut nodes can be disconnected from corresponding sense nodes (e.g., the nodes 414 and 415 corresponding to DL and DLb, respectively). For example, the isolation transistors (e.g., the transistors 451 and 452 of FIG. 4A) can be deactivated, thereby removing the corresponding direct connections between the nodes 414 and 416 and between the nodes 415 and 417, respectively. The gut nodes and/or the corresponding sense nodes can have complementary voltage levels (e.g., $V_{ARY}$ and $V_{SS}$). One or more of the power nodes (e.g., RNL node and/or the ACT node) can be at low voltage level (e.g., $V_{SS}$).

At block 702 (e.g., at t0 of FIG. 5B), the apparatus 100 can equalize the gut node voltages. In some embodiments, the apparatus 100 can activate the equalizing transistor (e.g., the transistor 418) to equalize the voltages at nodes 416 and 418. Accordingly, the voltages at the gut nodes can settle at a level that is between the complementary voltage levels, such as at about ½$V_{ARY}$. Since the sense nodes are not directly connected to the gut nodes, the voltages at the sense nodes can remain at complementary levels.

At block 704, the apparatus 100 can increase power node voltages (e.g., voltages at the RNL node and/or the ACT node). In some embodiments, the apparatus 100 can increase the voltage level at the RNL node before increasing the voltage level at the ACT node. In one or more embodiments, the apparatus 100 may increase the voltage level at the power nodes based on connecting the nodes to one or more power supplies and/or increasing outputs of the corresponding source/supply circuit.

At block 742, the apparatus 100 can bias the power transistors. In other words, the apparatus 100 can self-bias the transistors 410, 411, 412, and/or 413 based on increasing the power node voltages. Accordingly, at block 744, the apparatus 100 can precharge one or more of the corresponding nodes. For example, the apparatus 100 can precharge the gut nodes and/or the sense nodes (e.g., the nodes 414, 415, 416, and/or 417) based on biasing the power transistors. As described above, in some embodiments, the gut nodes can be precharged to $V_{ARY}$–vth0, and the sense nodes can be precharged to $V_{ARY}$ vth0–vth and $V_{ARY}$ vth0–vth–Δvth.

Based on isolating the gut nodes from the corresponding sense nodes, equalizing the gut node voltages, and increasing the power node voltages, the apparatus 100 can essentially combine the precharging operation with the compensation operation. Accordingly, the apparatus 100 can reduce/eliminate the time necessary for separately implementing the precharging and compensating operations. Further, the apparatus 100 can eliminate a separate precharging voltage (e.g., $V_{BLP}$) and any associated components (e.g., the transistor 319 of FIG. 3A and/or the transistors 369, 372, and/or 373 of FIG. 3B). Thus, the sense amplifier 400 can be implemented using less components, which in turn provides decreased circuit footprint, reduced circuit complexity, and reduction in associated operational and/or manufacturing errors. Moreover, the reduction in circuit complexity can lead to simpler connections, thereby reducing the complexity, size, and any associated operational and/or manufacturing errors for the metal layers that connect the circuits.

Blocks 702, 704, 742, and 744 can correspond to the first phase 482 of FIG. 4B. The following blocks and the corresponding processes can correspond to the second phase 484.

At block 706, the apparatus 100 can disconnect the gut nodes (e.g., the nodes 416 and 417) from each other. In some embodiments, the apparatus 100 can deactivate the equalizing transistor (e.g., the transistor 418) to remove the direct connection between the gut nodes. Accordingly, the voltages at the gut nodes can be independent of each other.

At block 708, the apparatus 100 can connect the gut nodes to corresponding sense nodes. For example, the apparatus 100 can activate the isolating transistors (e.g., the transistors 451 and 452) to provide a direct electrical connection between the nodes 414 and 416 and/or between the nodes 415 and 417, respectively.

At block 710, the apparatus 100 can determine the Vt mismatch between components. In some embodiments, the apparatus 100 can sample the voltages at the gut nodes and/or the sense nodes. The apparatus 100 can determine the Vt mismatch (e.g., Δvth) between transistors 412 and 413 based on comparing the voltages of the gut nodes and/or based on comparing the voltages of the sense nodes. In some embodiments, the apparatus 100 can determine the Vt mismatch before block 708, such as based on sampling and comparing the voltages at the sense nodes.

At block 712, the apparatus 100 can connect the sense amplifier to one of the memory cells. For example, the apparatus 100 can activate one of the word-lines in FIG. 2 to connect one of the memory cells to the digit line DL or the digit line DLb. Accordingly, the voltage at the corresponding sense node can be increased based on the connection. As described above, the voltages at the sense nodes and the connected gut nodes can be represented as $V_{ARY}$ vth0−vth+$V_{sig}$ for the node connected to the memory cell and $V_{ARY}$ vth0−vth−Δvth for the unconnected sense node.

At block 714, the apparatus 100 can decrease one or more of the power node voltages. For example, the apparatus 100 can decrease the voltage level at the RNL node. The apparatus 100 can decrease the voltage level based on disconnecting a supply circuit from the corresponding node, reducing an output of the supply circuit, and/or connecting the node to a lower potential (e.g., $V_{SS}$).

Based on one or more of the above-described operations, the sense amplifier 400 can generate an amplified output that represents a level of stored charges (e.g., stored information) in the connected memory cell. Accordingly, the apparatus 100 can use the output of the sense amplifier 400 to read the information stored in the connected memory cell.

At block 716, the apparatus 100 can reset the sense amplifier 400 to the initial state. For example, the apparatus 100 can deactivate the wordline, thereby disconnecting the memory cell from the sense amplifier. Further, the apparatus 100 can deactivate the isolation transistors (e.g., the transistors 451 and 452), thereby isolating gut nodes from corresponding sense nodes. In other words, the apparatus 100 can sever the connection between the nodes 414 and 416 and between the nodes 415 and 417. As represented by the feedback loop, the apparatus 100 can repeat the above-described method 800 for subsequent read operations.

Figure 8:
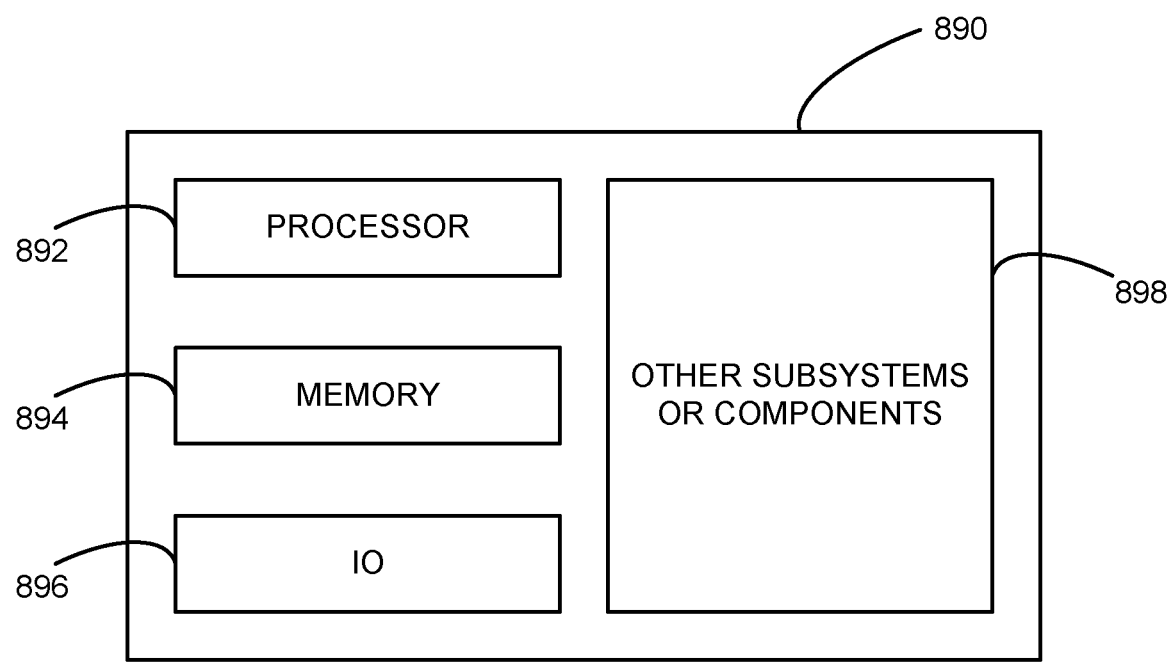
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 1-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to FIGS. 1-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

I claim:

1. An apparatus, comprising:
parallel sets of power circuits each including a gut node and a sensing node therein;
an isolation circuit connected between the gut node and the sense node; and
at least one equalizing transistor between the parallel sets of power circuits and connected to the gut node.

2. The apparatus of claim 1, wherein:
the parallel sets of power circuits include one or more power transistors connected to a unique isolation transistor;
the isolation circuit includes one or more isolation transistors connected to a unique transistor in the parallel sets of power circuits; and
each of the sense nodes is connected to a digit line configurable to connect a memory cell to the corresponding sensing node.

3. The apparatus of claim 1, wherein the parallel sets of power circuits, the isolation circuit, and the equalizing transistor are configured to:
equalize voltages at the gut nodes during a first phase; and
connect the sense nodes to a memory cell during a second phase following the first phase, the second phase for reading information stored in the connected memory cell.

4. The apparatus of claim 3, wherein the gut nodes are configured to operate without a direct connection to an external precharge voltage.

5. The apparatus of claim 3, wherein:
the equalizing transistor is connected between the gut nodes in the parallel sets of power circuits for providing a direct electrical connection between the gut nodes when activated; and
the isolation circuit is configured to provide a direct electrical connection between a corresponding sensing node and a corresponding gut node when activated.

6. The apparatus of claim 5, wherein:
the parallel sets of power circuits are configured to provide a precharge voltage at the gut nodes during the first phase based on connecting the gut nodes to a $V_{ARY}$ supply voltage;
the isolation circuit is configured to remove a direction connection between the corresponding gut node from the corresponding sense node during the first phase; and
the equalizing transistor is configured to (1) electrically couple the gut nodes while providing the precharge voltage and (2) disconnect the electrical coupling between the gut nodes after providing the first voltage.

7. The apparatus of claim 6, wherein the precharge voltage corresponds to a difference between the $V_{ARY}$ supply voltage and a voltage drop across the parallel sets of power circuits.

8. The apparatus of claim 6, wherein the parallel sets of power circuits, the isolation circuit, and the equalizing transistor are configured to precharge during the first phase, wherein the isolation circuit is further configured to provide the direct connection between the corresponding gut node and the corresponding sense node during the second phase.

9. The apparatus of claim 5, wherein:
the parallel sets of power circuits are configured to provide a first voltage and a second voltage at respective ones of the sense nodes during the first phase based on biasing one or more transistors connecting the sense nodes to a $V_{ARY}$ supply voltage, wherein a difference between the first and second voltages represent a mismatch associated with the one or more biased transistors; and
the isolation circuit is configured to remove a direct connection between the corresponding gut node from the corresponding sense node during the first phase.

10. The apparatus of claim 1, wherein the apparatus comprises a sense amplifier within a memory device.

11. A method of operating an apparatus, the method comprising:
increasing a voltage level at one or more power nodes with sensing nodes isolated from gut nodes and with the gut nodes electrically coupled together;
deactivating an equalizing transistor to disconnect the electrical coupling between the gut nodes;
activating isolation transistors to electrically couple each of the gut nodes to one of the sensing nodes; and
activating a wordline for connecting a memory cell to one of the sensing nodes for reading information stored in the memory cell.

12. The method of claim 11, wherein:
the apparatus includes a sense amplifier; and
increasing the voltage level and deactivating the equalizing transistor includes self-biasing one or more of the gut nodes and/or one or more of the sensing nodes.

13. The method of claim 12, wherein self-biasing the one or more nodes includes charging the gut nodes based on biasing one or more transistors connecting the gut nodes to voltages at one or more of the power nodes.

14. The method of claim 13, wherein self-biasing the one or more nodes includes charging the gut nodes without an external precharging voltage.

15. The method of claim 11, wherein increasing the voltage level includes simultaneously precharging the sensing nodes and compensating for threshold voltage mismatches between transistors within the apparatus.

16. The method of claim 11, wherein increasing the voltage level includes charging the sensing nodes and/or the gut nodes based on biasing transistors that connect the sensing nodes and/or the gut nodes to the power nodes.

17. The method of claim 16, further comprising sampling voltages at the sensing nodes to determine threshold voltages of the transistors connecting the sensing nodes to the power nodes.

18. A memory device, comprising:
memory cells;
a first digit line DL coupled to a first set of the memory cells;
a second digit line DLb coupled to a second set of the memory cells; and
a sense amplifier including:
a first sensing node directly connected to the first digit line DL,
a second sensing node directly connected to the second digit line DLb, and
a power node coupled to the first and second sensing nodes via a first power transistor and a second power transistor, respectively; and
wherein the sense amplifier is configured to:
simultaneously precharge the first and second sensing nodes and compensate for threshold voltage mismatches between the first and second power transistors for amplifying voltages on the first digit line DL and/or the second digit line DLb in determining information stored in one or more of the memory cells.

19. The memory device of claim 18, wherein the sense amplifier further includes:
a first gut node coupled to the first sensing node via a first isolation transistor;
a second gut node coupled to the second sensing node via a second isolation transistor, wherein the second gut node is coupled to the first gut node via an equalizing transistor;
a second power node coupled to the first and second gut nodes via a third power transistor and a fourth power transistor, respectively; and
wherein:
the sense amplifier is configured to charge the first and second gut nodes based on one or more voltage levels at the first and second sensing nodes, the power node, and/or the second power node.

20. The memory device of claim 18, wherein the sense amplifier is configured to charge the first and second gut nodes without a precharging voltage from a different source.

* * * * *